United States Patent [19]

Wisseman

[11] 3,870,967

[45] Mar. 11, 1975

[54] METHOD AND APPARATUS FOR ADJUSTMENT OF OFFSET VOLTAGE OF A DIFFERENTIAL AMPLIFIER

[75] Inventor: Leo L. Wisseman, Scottsdale, Ariz.

[73] Assignee: Motorola, Inc., Franklin Park, Ill.

[22] Filed: Aug. 17, 1973

[21] Appl. No.: 389,243

Related U.S. Application Data

[63] Continuation of Ser. No. 255,764, May 22, 1972, abandoned.

[52] U.S. Cl. ............... 330/30 D, 330/22, 330/38 M

[51] Int. Cl. ............................................. H03f 3/68

[58] Field of Search ........ 317/101; 330/30 D, 38 M, 330/69, 22

[56] References Cited

UNITED STATES PATENTS

| | | | |
|---|---|---|---|
| 3,441,804 | 4/1969 | Klemmer | 317/101 |
| 3,486,127 | 12/1969 | Beck et al. | 330/30 D |

*Primary Examiner*—Rudolph V. Rolinec
*Assistant Examiner*—Lawrence J. Dahl
*Attorney, Agent, or Firm*—Mueller, Aichele & Ptak

[57] ABSTRACT

The emitters of the transistors of a differential amplifier pair are isolated from one another by an interconnecting isolating resistor. Each emitter then further is connected to a common terminal through a plurality of parallel-connected fusible resistive links, each of which has a different fusing voltage, with the lowest fusing voltage being higher than the voltage which occurs across the links during normal operation of the differential amplifier. Adjustment of the input offset voltage is accomplished by applying a fusing voltage between the base of the transistor on the side of the differential amplifier to which the adjustment is to be made and the common terminal. The magnitude of the fusing voltage is selected to fuse or open one or more of the links connected between the emitter of the transistor to which the fusing voltage is applied and the common terminal in accordance with the amount of offset which is to be corrected.

9 Claims, 2 Drawing Figures

METHOD AND APPARATUS FOR ADJUSTMENT OF OFFSET VOLTAGE OF A DIFFERENTIAL AMPLIFIER

This is a continuation of application Ser. No. 255,764, filed May 22, 1972, now abandoned.

BACKGROUND OF THE INVENTION

In the volume production of integrated circuit operational amplifiers and particularly in the building of a multiple input amplifier with a common output stage, it is difficult to minimize variations in the input offset voltage of the different input differential amplifier stages. This can be accomplished by selecting amplifier devices that have the input stages matched; but when several input stages are fabricated on the same chip, this technique results in a very low yield. Consequently, the parts are high in cost and the ready availability of such parts is jeopardized.

While it is possible to compensate for or eliminate undesirable input offset voltages by using variable resistors in the collector circuits of the input differential amplifiers, or by connecting potentiometer resistors between the emitters of the various differential amplifier input stages, such techniques are impractical.

It is desirable to permit individual adjustment of the offset voltage of each differential amplifier fabricated on the chip independently of the other amplifiers to permit matching of the various input stages of a multiple input amplifier device and further to permit an increase in the yield of such devices thereby reducing their cost and improving the availability of such devices.

SUMMARY OF THE INVENTION

Accordingly, it is an object of this invention to provide an improved differential amplifier capable of adjustment of offset voltage.

It is another object of this invention to provide an improved method for adjusting the offset voltage of a differential amplifier.

It is a further object of this invention to use fusible resistive links to connect the emitters of the transistors in a differential amplifier with a common point.

In accordance with a preferred embodiment of this invention, a differential amplifier is constructed by connecting the emitters of the transistors of the differential amplifier to one another through an isolating resistor. The emitters further are connected to a common point through separate sets of parallel-connected fusible resistive links, each of which has a different fusing voltage. When an adjustment of the offset voltage of a differential amplifier is desired, the collectors of the transistors of the amplifier are open circuited and a fusing potential is applied between the base of the transistor on the side in which at least one of the fusible links is to be fused or opened and the common point. The magnitude of the fusing potential is selected to fuse one or more of the links in accordance with the amount of offset adjustment desired. After the desired number of links have been fused or opened, the amplifier then may be operated in its normal manner.

DETAILED DESCRIPTION

Figure 1:
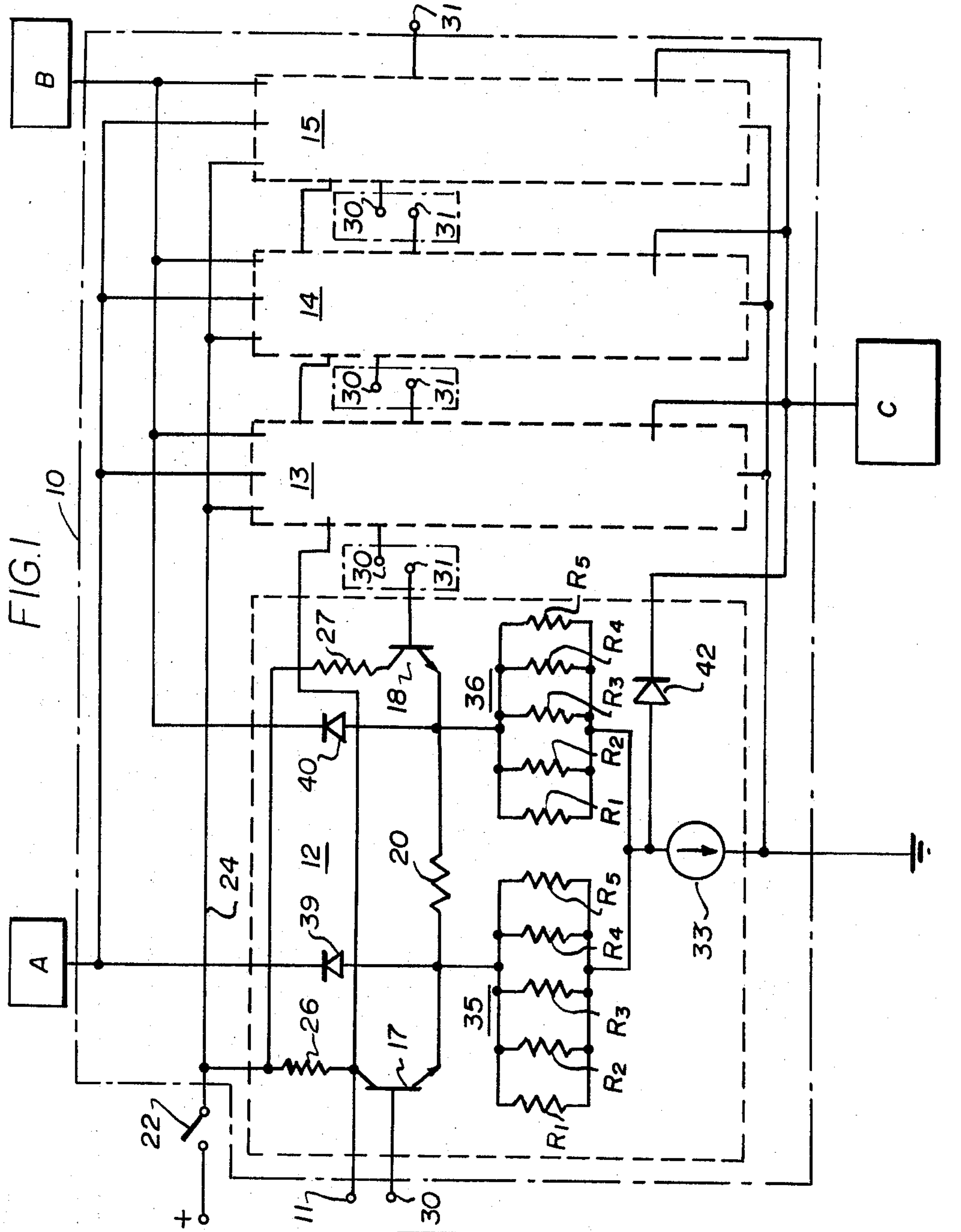
FIG. 1 is a circuit diagram, partially in schematic form, of a preferred embodiment of the invention.

Referring now to FIG. 1 there is shown an integrated circuit 10 which preferably is of monolithic construction. The circuit 10 includes four differential amplifiers interconnected as a four-channel, DC-coupled sense amplifier providing a single common output on a bonding pad 11. The four amplifier stages 12, 13, 14 and 15 are identical; so that only the stage 12 has been shown in detail, it being understood that the stages 13, 14 and 15 are similar to the stage 12.

Each of the differential amplifiers in the circuit 10 includes a pair of NPN transistors 17 and 18, the emitters of which are interconnected with one another through an isolating resistor 20. Operating potential for the transistors of the differential amplifiers 12–15 is obtained from a suitable B+ source (not shown) through a switch 22 connecting the source with a B+ supply lead 24, which in turn is connected to the collectors of the transistors 17 and 18 of the differential amplifiers through suitable load resistors 26 and 27. As shown in FIG. 1, the output from the differential amplifiers is obtained by connecting the collectors of all of the transistors 17 in the four differential amplifier stages in common to the output bonding pad 11. It is apparent that a similar output also could be obtained by connecting the collectors of all of the transistors 18 to a common output if this were desired.

To permit each of the differential amplifiers 12–15 to be utilized to sense a differential input, the bases of the transistors 17 and 18 each are coupled to respective bonding pads 30 and 31 across which differential input signals are independently applied to each of the amplifiers 12, 13, 14 and 15. To prevent variations in the input offset voltages of the amplifiers 12, 13, 14 or 15 from causing erroneous output signals to be obtained on the output bonding pad 11, it is necessary that the input stages 12, 13, 14 and 15 be matched as nearly as possible. Generally this is done by reducing the offset voltage of the differential amplifier stages to as near zero as possible.

Since it is difficult to obtain matching of the different stages of the differential amplifiers of the circuit 10 by adhering to close tolerances during the fabrication of the chip on which the amplifiers are formed, the emitters of the transistors 17 and 18 are connected to a current source 33 for each amplifier through respective sets of parallel-connected fusible resistors 35 and 36. Each of these sets of fusible resistors is shown as including five resistors R1, R2, R3, R4 and R5 formed by different widths of suitable fusible material, such as nichrome. The width and length of each of the resistive links R1 to R5 is selected to cause the link to be fused or opened by the application thereacross of a particular different fusing voltage.

The following chart illustrates typical values of resistance of the fusible links, the fusing voltage for such links, and the corresponding change in the input offset voltage measured across the resistor 20 where the maximum emitter current of the amplifier under normal operating conditions is ½ milliamp and the value of resistance of the resistor 20 is 10 ohms:

| Resistance | Fusing Voltage | $V_{IO}$ Change |
|---|---|---|
| $R_1 = 200\ \Omega$ | 6V | 0.65mv |
| $R_2 = 216\ \Omega$ | 6.5V | 1.33mv |
| $R_3 = 232\ \Omega$ | 7V | 1.98mv |
| $R_4 = 248\ \Omega$ | 7.5V | 3.10mv |
| $R_5 = 264\ \Omega$ | 8V | 4.56mv |

If there is no undesirable input offset voltage in any one of the differential amplifier circuits 12, 13, 14 or 15 for a condition when no differential voltage exists across the input terminals 30 and 31 for that amplifier, the potential on each end of the resistor 20 is the same and no voltage is measured across it. In such an event when the amplifier is operated by closure of the switch 22 to apply B+ operating potential to it and by biasing the current source 33 for the amplifier into operation, the output of the amplifier will correctly indicate the relationship of the differential input signals applied to the basis of the transistors 17 and 18. Although an attempt is made in the fabrication of the amplifier circuit on the chip 12 to cause this to happen, variations in the processing of the chip often result in a detectable offset voltage in one direction or the other across the resisitor 20 even though no differential voltage is applied to the terminals 30 and 31.

When such an offset voltage is measured, the amount and polarity of the measured offset voltage is used to determine whether one or more of the resistors in the sets 35 or 36 for the amplifier should be fused or opened to reduce or eliminate the offset detected across the resistor 20. Selection of the particular one of the sets 35 or 36 to which the fusing or opening of selected resistors R1 to R5 is to be effected is determined by the polarity of the offset voltage detected across the resistor 20.

To permit adjustment of the offset of the amplifier three additional bonding pads, A, B and C, are provided. The junction of the emitter of the transistor 17 in each of the amplifiers 12, 13, 14 and 15 with the resistor 20 is coupled through an isolating diode 39 to the bonding pad A. Similarly, the emitter of the transistor 18 in each of the differential amplifiers 12, 13, 14 and 15 is coupled through an isolating diode 40 to the bonding pad B. The common terminal of each of the differential amplifiers 12, 13, 14 and 15, where the lower ends of the fusible resistors in the sets 35 and 36 are coupled to the current source 33, is coupled through an isolating diode 42 to the bonding pad C.

If it has been determined that an offset adjustment is necessary, the side of the particular differential amplifier 12, 13, 14 or 15 to which the adjustment must be made and the amount can be determined as discussed above by measuring the offset voltage across the resistor 20 for the amplifier. For purposes of illustration, assume that an offset adjustment has been determined for the emitter circuit of the transistor 17 in the differential amplifier 12. When an adjustment is to be made to this circuit, it is necessary to apply an offset adjustment or fusing voltage across the resistors R1, R2, R3, R4 and R5 of the set 35 in an amount sufficient to fuse or open circuit the particular number of resistors R1 to R5 needed to cause the offset voltage change $V_{10}$ which most nearly cancels the measured input voltage offset of the circuit prior to offset adjustment.

During the application of an offset fusing voltage across the desired set 35 or 36 of fusible resistive links, operating potential to the circuit is terminated or removed, and this is illustrated in FIG. 1 by opening of the switch 22. At the same time, the current source 33 for the differential amplifier also is disabled. In a typical amplifier, the current source 33 is provided with an operating biasing potential from the B+ supply on lead 24, so that opening of the switch 22 also accomplishes the purpose of disabling the current source of 33.

Figure 2:
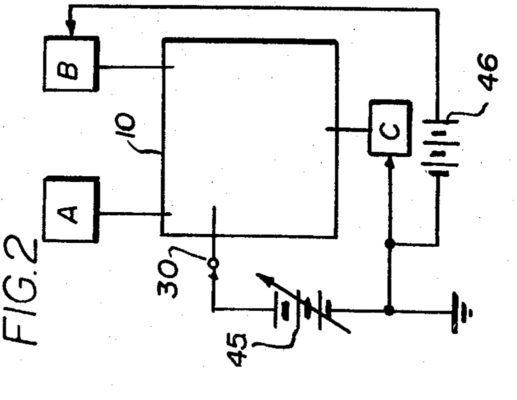
FIG. 2 is a block diagram useful in explaining the method of adjusting the offset voltage of the circuit shown in FIG. 1.

With normal operating potential being removed from the chip 10 and with the offset adjustment being made to the differential amplifier 12 on the side including the transistor 17, an offset adjustment fusing voltage is applied between the base of the transistor 17 at the bonding pad 30 and bonding pad C which is connected to the lower side of the fusible resistive link set 35 by way of the isolating diode 42. The application of this offset adjustment voltage is indicated in FIG. 2 by the connection of a variable DC potential illustrated in the form of a variable battery 45.

The magnitude of potential applied between the base of the transistor 17 and the bonding pad C is selected to be sufficient to fuse or open the desired number of resistors R1 to R5 which effects the desired offset compensation. If only the resistor R1 is to be fused or opened, the fusing voltage applied across the resistor set 35 is greater than the fusing voltage of resistor R1 and less than the fusing voltage of resistor R2 (for the circuit illustrated by the above-cited chart, this is greater than 6 volts and less than 6.5 volts to avoid fusing or opening the resistor R2).

Of course, the actual potential difference applied between the base of the transistor 17 on terminal 30 and the bonding pad C must take into consideration the voltage drops across the base-emitter junction of transistor 17 and the drop across the diode 42. The potential also is applied in the polarity shown in FIG. 2 to forward bias the diode junctions formed by the base-emitter junction of the transistor 17 and the diode 42.

In the example under consideration, application of a voltage across the resistor set 35 between 6 and 6.5 volts is sufficient to burn out or open circuit the resistor R1. This changes the total value of resistance of the resistor set 35 relative to the resistor set 36 to effect a change in the offset voltage of 0.65 millivolts for a typical circuit having component values of the type illustrated in the chart.

To prevent any of the resistors R1 to R5 in the set 36 from being opened or fused during this operation, the bonding pad B is connected through a source of potential 46 to the bonding pad C to clamp the potential on the emitter of the transistor 18 to a potential which will prevent the fusing or opening of any of the resistors 36. This potential is substantially equal to the potential applied to the lower end of the resistors R1 to R5 of the set 36, so that any potential appearing across any of the resistors of this set is far below the 6 volts necessary to fuse or open the resistor R1 having the lowest fusing voltage in the set 36. Thus none of the resistors in the resistor set 36 is fused or opened by the application of the fusing adjustment voltage to the base of the transistor 17.

If the input voltage offset measured for the differential amplifier 12 prior to adjustment indicates that more than the resistor R1 of the resistor set 35 should be opened or fused, the fusing voltage applied to the base of the transistor 17 is increased to fuse additional ones of the resistors R1 to R5 to effect the desired change in $V_{IO}$. In the circuit under consideration, if the potential is sufficient to cause a voltage between 7 and 7.5 volts to appear across the resistors R1 to R5 of the set 35, resistors R1, R2 and R3 all will be fused or opened, with only the resistors R4 and R5 of the set 35 remaining connected in the circuit. For the circuit which is illustrated this causes a change in the offset voltage of 1.98 millivolts.

If adjustment of the input voltage offset by opening or fusing resistors in the emitter circuit of the transistor 18 is desired for any of the differential amplifiers 12, 13, 14 or 15, the fusing adjustment voltage is applied between the base of the transistor 18 for the amplifier which is to be adjusted and the bonding pad C. The bonding pad A then is connected to the potential 46 and the bonding pad B is opencircuited. The diode 39 then prevents the application of a voltage across the resistors R1 to R5 of the set 35 great enough to fuse any resistors of this set, while the offset adjustment of the resistors R1 to R5 of the set 36 is effected in the same manner discussed above in conjunction with the transistor 17 and the resistor set 35.

By utilizing the technique described above, it is possible to independently adjust the offset voltage of each of the several differential amplifier circuits 12, 13, 14 and 15 formed on the common chip without affecting any of the other differential amplifiers.

Once offset adjustment of all of the differential amplifiers 12, 13, 14 and 15 has been accomplished, the circuit connections to the adjustment bonding pads A, B and C are removed; and no connections are made to these bonding pads during normal operation of the circuit. Operating potential then is applied to the circuit over the lead 24, and in the illustration this is accomplished by closing the switch 22. Application of operating potential to the chip 10 also activates the current source of 33 in each of the differential amplifier circuits. Differential input signals then may be applied between the bonding pads 20 and 31 for each of the differential amplifier circuits for normal operation of the circuits on chip 10. The diodes 39, 40 and 42 serve to isolate the differential amplifier circuits 12, 13, 14 and 15 from one another, so that it is not necessary to employ more than the three bonding pads A, B and C to effect the offset adjustment operation.

It should also be noted that during normal operation of the circuit, the emitter current of the transistors 17 and 18 is of the order of ½ to 1 milliamps. Depending upon the number of resistors R1 to R5 in each of the emitter circuits, the voltage across the resistor sets 35 or 36 is less than 1 volt and typically varies between 15 and 264 millivolts. It is apparent that this operating voltage is far less than even the minimum 6 volt fusing voltage which is utilized to fuse or open the resistor R1 in the example previously described.

The values of the composite resistance for the resistor sets 35 and 36 should be selected to minimize the effect of these resistors on the voltage gain of the differential amplifier. It is preferable that the variation between minimum and maximum for these resistor sets will result in less than ten percent variation in the voltage gain of the amplifier. The particular value of the resistance of the resistor 20 is determined by the emitter current of the transistors 17 and 18 to provide the proper incremental changes in the input offset voltage $V_{IO}$. For example, if the emitter current attainable by either of the transistors 17 or 18 is equal to 1 milliamp, the maximum change in $V_{IO}$ would be 10 millivolts with a 10 ohm value of resistance for the resistor 20. The values for the fusible resistive links R1 to R5 given in the illustration are typical and have been found to minimize the effect of the offset adjustment circuit on the voltage gain of the differential amplifier circuits.

I claim:

1. A method for adjusting the input offset voltage of a differential amplifier including first and second transistors, each having at least emitter, base, and collector electrodes and with the emitters thereof interconnected through a resistor and each emitter further connected to a common point through first and second separate pluralities of parallel fusible resistors, respectively, each resistor in each of said first and second pluralities of resistors having a different fusing voltage, said method including the steps of:

open circuiting the collectors of said first and second transistors; and applying a voltage of a predetermined magnitude between the base of said first transistor and said common point, the polarity of such voltage selected to forward bias the base-emitter junction of said first transistor to simultaneously apply a voltage across all of the resistors of said first plurality of resistors connected to the emitter of said first transistor of a magnitude exceeding the fusing voltage of a predetermined number of such fusible resistors of said first plurality of resistors, and simultaneously maintaining the voltage across said second plurality of fusible resistors connected between the emitter of said second transistor and said common point at a value less than the fusing voltage of any resistors of said second plurality to prevent undesired fusing of any resistors of said second plurality of resistors.

2. The method according to claim 1, wherein maintaining the voltage across said second plurality of fusible links comprises the step of connecting said common point and the emitter of said second transistor with a common potential.

3. The method according to claim 1 wherein the step of open circuiting the collectors of said first and second transistors comprises disconnecting the collectors of said transistors from the source of operating potential and wherein maintaining the voltage across said second plurality of fusible resistors includes the step of connecting the emitter of said second transistor and said common point with a common potential.

4. A method for independent adjustment of the offset voltage of any one of a plurality of integrated circuit differential amplifiers formed on a common chip and each including at least first and second transistors, each having at least base, collector, and emitter electrodes, with the emitter electrodes of the first and second transistors of each of said differential amplifiers being connected to a common point for each differential amplifier through a respective different plurality of parallel fusible resistors, each fusible resistor in each of said pluralities of fusible resistors having a different fusing voltage, said method including the steps of:

open circuiting the collectors of said transistors of at least one of said differential amplifiers, the offset voltage of which is to be adjusted; and applying a voltage of a predetermined magnitude between the base of said first transistor of said one of said differential amplifiers and said common point for said one differential amplifier, said voltage being of a polarity to forward bias the base-emitter junction of said first transistor to simultaneously apply a voltage across all of said resistors of the plurality of resistors connected to the emitter of said first transistor of a magnitude exceeding the fusing voltage of a predetermined number of such fusible resistors connected between the emitter of said first transistor and said common point, and simultaneously maintaining the potential across said plurality of fusible resistors connected between the emitter of said second transistor of said one differential amplifier and said common point of said one differential amplifier at a value is less than the fusing voltage of any of such resistors to prevent undesired fusing of any resistors connected between the emitter of said second transistor and said common point.

5. An integrated circuit differential amplifier capable of offset voltage adjustment including in combination:

first and second voltage supply terminals;

first and second transistors each having collector, base, and emitter electrodes;

means coupling the collectors of said first and second transistors with said first voltage supply terminal;

an isolating resistor connected between the emitters of said first and second transistors;

a common terminal;

a first plurality of parallel fusible resistors, each resistor having a different fusing voltage, connected between the emitter of said first transistor and said common terminal;

a second plurality of parallel fusible resistors, each resistor having a different fusing voltage, connected between the emitter of said second transistor and said common terminal;

current source means coupled between said common terminal and said second voltage supply terminal;

a first bonding pad;

means coupling the emitter of said first transistor with said first bonding pad;

a second bonding pad;

means coupling the emitter of said second transistor with said second bonding pad; and a third bonding pad coupled with said common terminal;

whereby said first, second and third bonding pads permit external circuit connections to be made with the emitters of said first and second transistors and said fusible resistors for offset voltage adjustment of said differential amplifier.

6. The combination according to claim 5 wherein each of said first and second pluralities of fusible resistors includes at least first and second fusible resistors, with corresponding fusible resistors in said first and second pluralities of fusible resistors having the same fusing voltage.

7. The combination according to claim 5 further including isolating diode means connecting said common terminal with said third bonding pad.

8. The combination according to claim 7 further including at least a second differential amplifier having third and fourth transistors therein, each having collector, base, and emitter electrodes; a second isolating resistor connected between the emitters of said third and fourth transistors; a second common terminal for said second differential amplifier; second and third pluralities of fusible parallel resistors, each resistor of each of said second and third pluralities having different fusing voltage, connected respectively between the emitters of said third and fourth transistors and said second common terminal; isolating diode means connecting the emitters of said first and third transistors with said first bonding pad; isolating diode means connecting the emitters of said second and fourth transistors with said second bonding pad; and isolating diode means connecting said second common terminal with said third bonding pad.

9. The combination according to claim 7 further including second and third diodes connecting the emitters of said first and second transistors, respectively, with said first and second bonding pads.

* * * * *